(12) United States Patent
Nakajima et al.

(10) Patent No.: US 8,347,241 B2
(45) Date of Patent: Jan. 1, 2013

(54) PATTERN GENERATION METHOD, COMPUTER-READABLE RECORDING MEDIUM, AND SEMICONDUCTOR DEVICE MANUFACTURING METHOD

(75) Inventors: Fumiharu Nakajima, Yokohama (JP); Toshiya Kotani, Machida (JP); Hiromitsu Mashita, Kawasaki (JP); Chikaaki Kodama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 474 days.

(21) Appl. No.: 12/354,119

(22) Filed: Jan. 15, 2009

(65) Prior Publication Data

US 2009/0186424 A1 Jul. 23, 2009

(30) Foreign Application Priority Data

Jan. 18, 2008 (JP) ................................ 2008-009231

(51) Int. Cl.
*G06F 17/50* (2006.01)
(52) U.S. Cl. .............. 716/55; 716/53; 716/54; 716/110; 716/111
(58) Field of Classification Search .................... 716/53, 716/54, 55
See application file for complete search history.

(56) References Cited

U.S. PATENT DOCUMENTS

| 6,577,994 | B1 | 6/2003 | Tsukuda |
| 6,785,874 | B2 * | 8/2004 | Tsukuda ......................... 716/52 |
| 2006/0083995 | A1 * | 4/2006 | Kanai .............................. 430/5 |
| 2006/0271907 | A1 | 11/2006 | Izuha et al. |
| 2007/0003881 | A1 * | 1/2007 | Ito et al. ........................ 430/313 |
| 2008/0235650 | A1 | 9/2008 | Ito et al. |

FOREIGN PATENT DOCUMENTS

JP 2006-186104 7/2006

* cited by examiner

*Primary Examiner* — Vuthe Siek
*Assistant Examiner* — Eric Lee
(74) *Attorney, Agent, or Firm* — Finnegan, Henderson, Farabow, Garrett & Dunner, L.L.P.

(57) ABSTRACT

A pattern generation method includes: acquiring a first design constraint for first patterns to be formed on a process target film by a first process, the first design constraint using, as indices, a pattern width of an arbitrary one of the first patterns, and a space between the arbitrary pattern and a pattern adjacent to the arbitrary pattern; correcting the first design constraint in accordance with pattern conversion by the second process, and thereby acquiring a second design constraint for the second pattern which uses, as indices, two patterns on both sides of a predetermined pattern space of the second pattern; judging whether the design pattern fulfils the second design constraint; and changing the design pattern so as to correspond to a value allowed by the second design constraint when the design constraint is not fulfilled.

17 Claims, 11 Drawing Sheets

|  | MINIMUM S2 | MAXIMUM S1 |
|---|---|---|
| $300 \leq S1 < 400$ | 200 | 400 |
| $400 \leq S1 < 500$ | 200 | 500 |
| ⋮ | ⋮ | ⋮ |

PATTERN GENERATION METHOD, COMPUTER-READABLE RECORDING MEDIUM, AND SEMICONDUCTOR DEVICE MANUFACTURING METHOD

CROSS REFERENCE TO RELATED APPLICATION

This application claims benefit of priority under 35USC §119 to Japanese patent application No. 2008-009231, filed on Jan. 18, 2008, the contents of which are incorporated by reference herein.

BACKGROUND OF THE INVENTION

1. Field of the Invention

The present invention relates to a pattern generation method, a computer-readable recording medium, and a semiconductor device manufacturing method.

2. Related Background Art

Recent advances in semiconductor manufacturing technologies have been remarkable, and semiconductor devices sized at a minimum processing dimension of 0.07 μm are mass-produced. Such miniaturization is enabled by significant progresses in micropattern forming techniques such as a mask process technique, a photolithographic technique and an etching technique. When the size of a pattern was great enough, a planar shape of an LSI pattern to be formed on a wafer was drawn as it is as a design pattern, a mask pattern faithful to the design pattern was generated, the mask pattern was transferred onto the wafer by a projection optical system, and a foundation was etched, such that a pattern substantially conforming with the design pattern could be formed on the wafer.

However, it is becoming more and more difficult to form a faithful pattern in each process along with the advance in the miniaturization of patterns, which has raised a problem of the inconformity of a finish dimension with that of a design pattern. In order to solve such a problem, techniques such as process proximity correction (PPC) or optical proximity correction (OPC) are used to generate a mask pattern different from a design pattern by taking into account the difference of conversion among processes so that a finish dimension may be equal to the dimension of the design pattern.

There are presently various discussions on next-generation lithographic techniques. While EUV exposure directed to shorter wavelengths has been lively discussed for the mass production of semiconductors sized at 0.03 μm, there are other proposals such as a multiple patterning process which combines an exposure apparatus presently used in mass production with a pattern formation method different from conventional methods.

In a sidewall mask manufacturing process which is one of the multiple patterning processes, a lithographic step and steps other than the lithographic step are combined together to form a pattern for forming a circuit pattern on a wafer. Thus, a resist pattern formed in the lithographic step diverges from a design circuit pattern. If a conventional design constraint is used which defines a line width and a space width in accordance with whether a resist pattern can be formed, it is difficult to design a circuit pattern, and a design constraint suitable to the sidewall mask manufacturing process is required.

SUMMARY OF THE INVENTION

According to a first aspect of the present invention, there is provided a pattern generation method of a design pattern for use in circuit pattern formation, the method comprising:

acquiring a design constraint for a first patterns which uses, as indices, a pattern width of an arbitrary one of the first patterns, and a space between the arbitrary pattern and a pattern adjacent to the arbitrary pattern, the first patterns being to be formed on a film by a first process;

correcting the design constraint for the first patterns in accordance with pattern conversion by a second process used to form a second pattern on the film on the basis of the arbitrary one of the first patterns, and thereby acquiring a design constraint for the second pattern which uses, as indices, two pattern spaces on both sides of a predetermined pattern of the second pattern, or two patterns on both sides of a predetermined pattern space of the second pattern, the second pattern being to be used to form a circuit pattern on the film in conformity with the design pattern corresponding to the second pattern;

judging whether the design pattern fulfils the design constraint for the second pattern; and changing the design pattern so as to correspond to a value allowed by the design constraint in the case where the design constraint is not fulfilled.

According to a second aspect of the present invention, there is provided a computer-readable recording medium containing a program which causes a computer to execute a pattern verifying method of a design pattern for use in circuit pattern formation, the method comprising:

acquiring a design constraint for a first patterns which uses, as indices, a pattern width of an arbitrary one of the first patterns, and a space between the arbitrary pattern and a pattern adjacent to the arbitrary pattern, the first patterns being to be formed on a film by a first process;

correcting the design constraint for the first patterns in accordance with pattern conversion by a second process used to form a second pattern on the film on the basis of the arbitrary one of the first patterns, and thereby acquiring a design constraint for the second pattern which uses, as indices, two pattern spaces on both sides of a predetermined pattern of the second pattern, or two patterns on both sides of a predetermined pattern space of the second pattern, the second pattern being to be used to form a circuit pattern on the film in conformity with the design pattern corresponding to the second pattern;

judging whether the design pattern fulfils the design constraint for the second pattern.

According to a third aspect of the present invention, there is provided a semiconductor device manufacturing method comprising:

acquiring first patterns to be formed on a film by a first process from a design pattern that is generated by use of a pattern generation method of the design pattern for use in circuit pattern formation;

forming a mask to transfer and form the acquired first patterns;

exposing the formed mask to light to form the first patterns on the film;

forming a second pattern on the film by a second process subsequent on the basis of the first patterns, the second pattern being used to form a circuit pattern on the film in conformity with the design pattern corresponding to the second pattern; and processing the film by use of the second pattern to form the circuit pattern on the process target film;

the pattern generation method including:

acquiring a design constraint for a first patterns which uses, as indices, a pattern width of an arbitrary one of the first patterns, and a space between the arbitrary pattern and a pattern adjacent to the arbitrary pattern;

correcting the design constraint for the first patterns in accordance with pattern conversion by the second process used to form a second pattern on the film on the basis of the arbitrary one of the first patterns, and thereby acquiring a design constraint for the second pattern which uses, as indices, two pattern spaces on both sides of a predetermined pattern of the second pattern, or two patterns on both sides of a predetermined pattern space of the second pattern;

judging whether the design pattern fulfils the design constraint for the second pattern; and changing the design pattern so as to correspond to a value allowed by the design constraint in the case where the design constraint is not fulfilled.

DETAILED DESCRIPTION OF THE INVENTION

Hereinafter, embodiments of the present invention will be described with reference to the drawings. It is to be noted that like reference numbers are assigned to like parts throughout the drawings and repeated explanations of these parts are properly omitted.

(1) First Embodiment

A first embodiment of a pattern generation method according to the present invention is described with reference to FIG. 1 to FIG. 14. In the present embodiment, the invention is applied to the pattern generation method in a sidewall mask manufacturing process.

Figure 1:
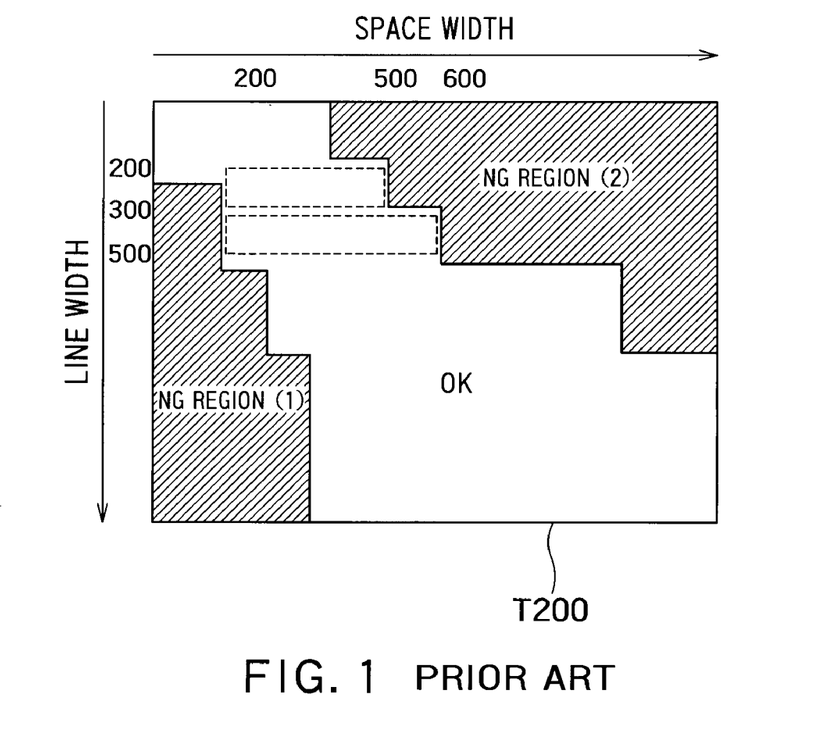
FIGS. 1 and 2 are explanatory diagrams of a prior art.
Figure 2:
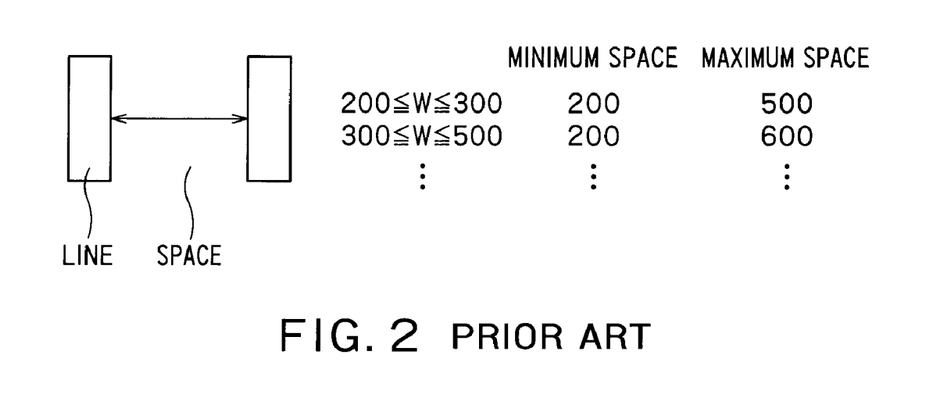

First, a design constraint generating method according to a prior art is described with reference to FIG. 1 and FIG. 2. FIG. 1 shows a two-dimensional table T200 visibly indicating whether pattern formation is permitted as a matrix table using a line width and a space width as indices, with regard to a plurality of wiring patterns which are combinations of circuit patterns different in line width and space width. Such a table can be acquired by executing an optical simulation to see whether pattern formation can be carried out for all the combinations of the line widths and space widths under an optical condition where a mask in which a mask pattern corresponding to a circuit pattern is formed is exposed to light.

For example, it can be read from the two-dimensional table T200 shown in FIG. 1 that a pattern having a space of 200 nm to 500 nm can only be formed at a line width of 200 nm to 300 nm and that patterns with other spaces can not be formed. Thus, in the prior art, pattern formation permitted/inhibited regions are defined in the matrix table composed of the line width and space width in order to generate a design constraint defining, for example, a line width W and a space width as shown in FIG. 2.

Figure 3:
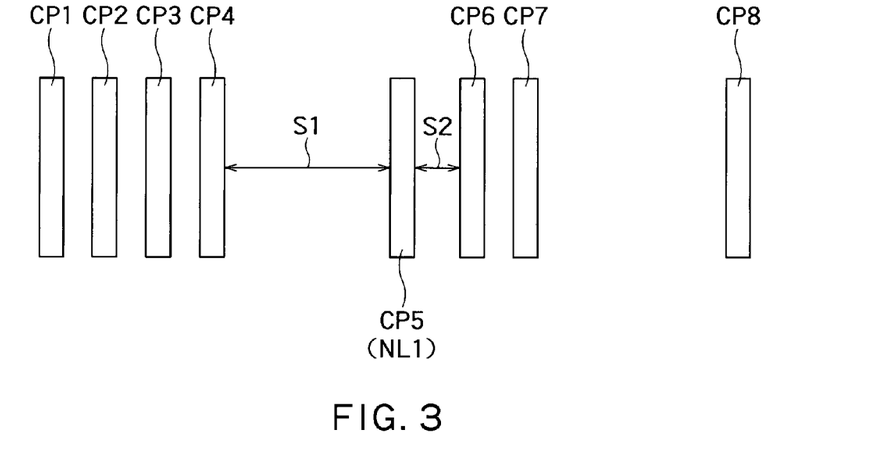
FIG. 3 is a diagram showing one example of circuit patterns to be formed on a wafer by a line sidewall preserving process.
Figure 4:
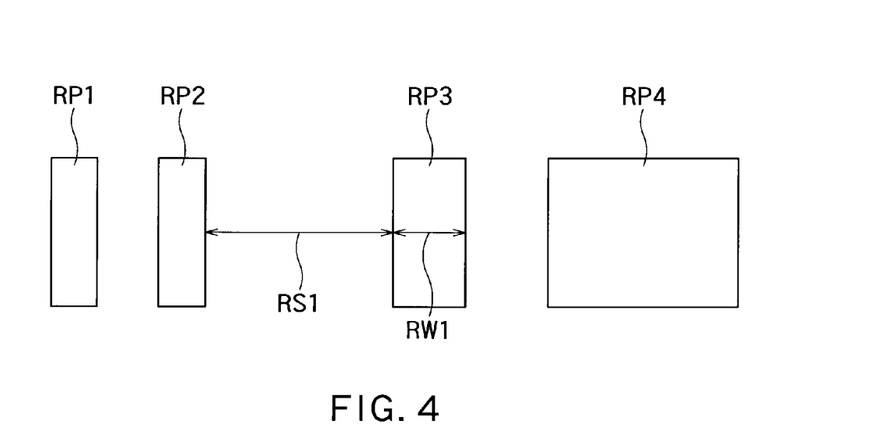
FIG. 4 is a diagram showing resist patterns for forming the circuit patterns shown in FIG. 3.

The basic concept of a design constraint used in the pattern generation method of the present embodiment is described with reference to FIG. 3 and FIG. 4. FIG. 3 shows circuit patterns CP1 to CP8 as one example of circuit patterns to be formed on a wafer by a line sidewall preserving process of the sidewall mask manufacturing process. FIG. 4 shows resist patterns RP1 to RP4 to form the circuit patterns CP1 to CP8 shown in FIG. 3.

The relation between the circuit patterns CP1 to CP8 corresponding to a design pattern in FIG. 3 and the resist patterns RP1 to RP4 in FIG. 4 is as follows: Focusing on, for example, the circuit pattern CP5 among the circuit patterns CP1 to CP8, a space S1 between the circuit pattern CP5 and the circuit pattern CP4 adjacent to the left of the circuit pattern CP5 in the drawing corresponds to a space (resist space) RS1 between the resist patterns RP2 and RP3 in FIG. 4. Moreover, a space S2 between the circuit pattern CP5 and the circuit pattern CP6 adjacent to the right of the circuit pattern CP5 in the drawing corresponds to a line (resist line) width RW1 of the resist pattern RP3 in FIG. 4.

Figure 5:
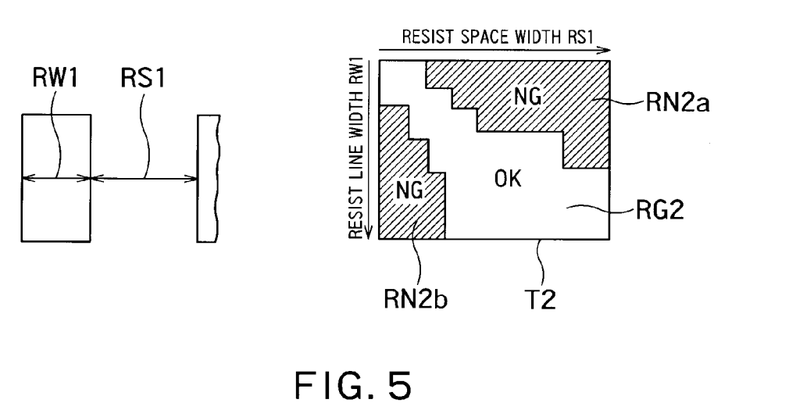
FIG. 5 is a diagram showing one example in which a matrix table composed of a resist line width and a resist distance width is generated by a method according to a prior art to define pattern formation permitted/inhibited regions.
Figure 6:
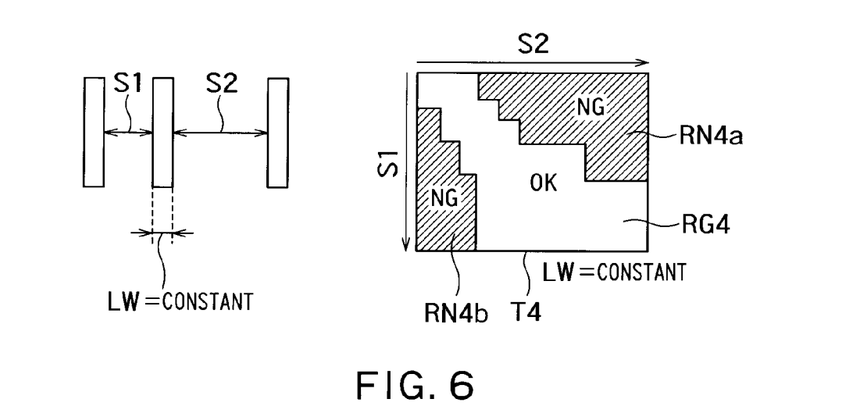
FIG. 6 is a diagram explaining a method of generating a design constraint in a first embodiment of the present invention.

Here, a space between a line width in a design constraint generating process in the prior art and an adjacent line is regarded as a space (resist space width) between the line width (resist line width) of a resist pattern and an adjacent resist pattern. A circuit line width to be formed is constant in the line sidewall preserving process. Thus, a matrix table is generated for the resist patterns by the method according to the prior art to define pattern formation permitted/inhibited regions. Then, the resist line width and the resist space width are matched with space widths S1, S2 between a circuit pattern to be generated and adjacent patterns on one side and the other thereof, and the pattern formation permitted/inhibited regions are then defined. Consequently, a design constraint applicable to the line sidewall preserving process can be generated. A two-dimensional table T2 shown in FIG. 5 is one example of a two-dimensional table; a matrix table composed of the resist line width RW1 and the resist space width RS1 is generated by the method according to the prior art for a resist pattern (first pattern), and then pattern formation permitted/inhibited regions RN2a, 2b and RG2 are defined in the generated table. FIG. 6 shows a two-dimensional table T4 as an example in the case where a line width is constant as described above; pattern formation permitted/inhibited regions RN4a, 4b and RG4 have already been defined in a matrix table by acquiring the space widths S1, S2 from the resist line width RW1 and the resist space width RS1 in accordance with a method described later. If the pattern formation permitted/inhibited regions are defined in such a matrix table, a design constraint defining the space widths S1, S2 adjacent to a line of interest can be generated, as shown in FIG. 7.

The circuit line width is constant in the above-mentioned example. However, when different circuit line widths can be formed, a three-dimensional table may be generated by producing a three-dimensional matrix space where the space width S1 is set on an x-axis, the space width S2 is set on a y-axis, and a line width LW between these spaces is set on a z-axis, and then defining pattern formation permitted/inhibited regions in this matrix space.

Figure 7:
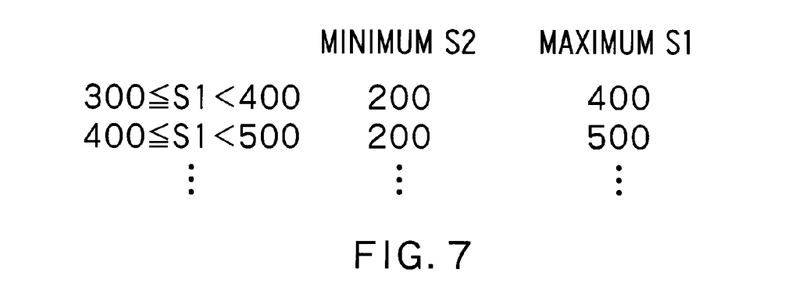
FIG. 7 is a diagram showing one example of the design constraint in the first embodiment of the present invention.

A method of generating a design constraint for a design pattern shown in FIG. 7 is more specifically described with reference to FIG. 8.

Figure 8:
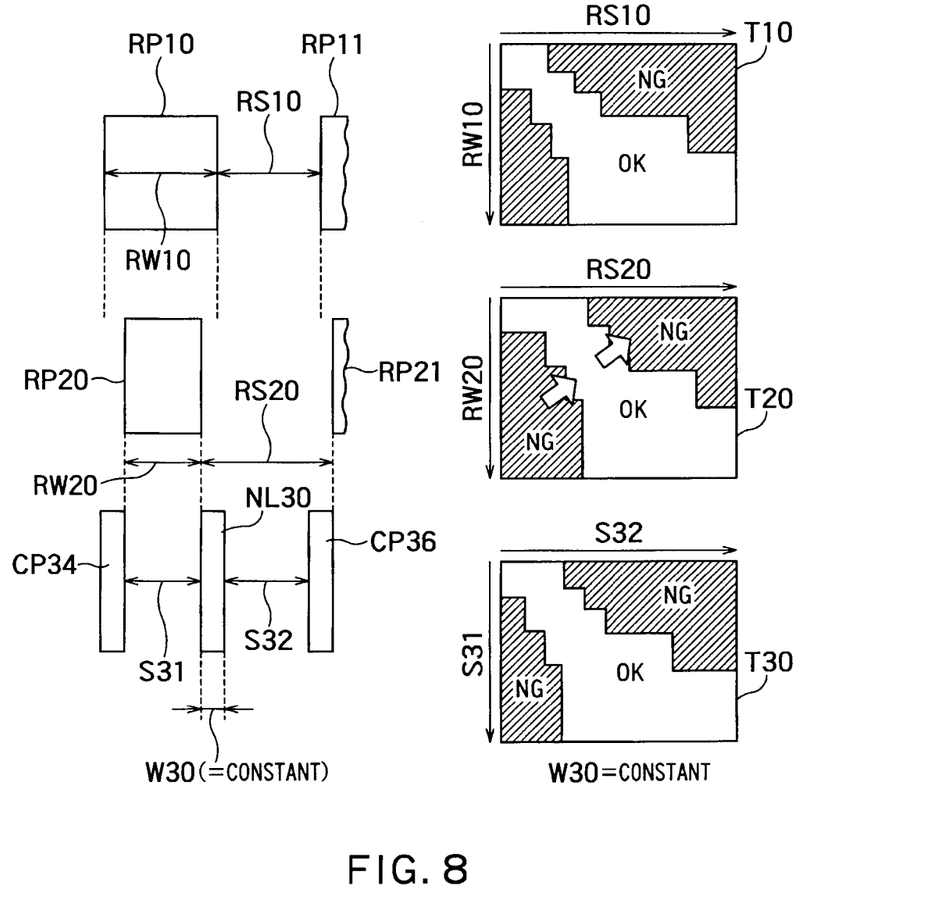
FIG. 8 is a diagram explaining a specific method of generating the design constraint shown in FIG. 7.

First, as shown in the upper section of FIG. 8, pattern formation permitted/inhibited regions are defined in a matrix table. This matrix table has been set by the method according to the prior art using, as indices, a resist line width RW10 of a resist pattern RP10 which is any one of resist patterns (first patterns) formed on a process target film by a lithographic step, and a resist space width RS10 which is an interval between the resist pattern RP10 and an adjacent resist pattern RP11. Thus, a two-dimensional table T10 serving as a design constraint is generated.

Then, the two-dimensional table T10 is corrected in accordance with a process conversion difference because the resist line width RW10 and the resist space width RS10 vary due to a process conversion difference in, for example, a slimming process (second process) as in resist patterns RP20, RP21 shown in the middle section of FIG. 8. A two-dimensional table T20 in the right of the middle section of FIG. 8 shows one example of the result of such a correction. Here, the process conversion difference includes at least one of the amount of slimming, the amount of a process conversion difference and the amount of a mask conversion difference based on, for example, an etching step (second process) in a slimming step, in a development step and in the process of transferring a resist pattern to an intermediate film serving as a foundation.

In the line sidewall preserving process (second process), a sidewall film is formed on a slimmed resist pattern sidewall or the sidewall of a hard mask pattern on which the resist pattern has been transferred, and this sidewall film is used as a mask to form a line pattern. A linear circuit pattern is formed at the position of the sidewall film. However, the slimming step and the step of transferring onto a hard mask can be omitted.

On the basis of a pattern conversion relation in the second process, a resist line width RW20 in the two-dimensional table T20 in the right of the middle section of FIG. 8 is matched with a space S31 between a circuit pattern CP34 adjacent to the left of a line of interest NL30 of the circuit pattern and the line of interest NL30, and a space width RS20 of the two-dimensional table T20 is matched with a space S32 between a circuit pattern CP36 adjacent to the right of the line of interest NL30 of the circuit pattern and the line of interest NL30. Thus, as shown in the right of the lower section of FIG. 8, a two-dimensional table T30 is acquired in which the pattern formation permitted/inhibited regions RN4a, 4b and RG4 have already been defined.

Next, a pattern generation method using the design constraint generated by the above-mentioned method is described with reference to FIG. 9 to FIG. 13.

Figure 9:
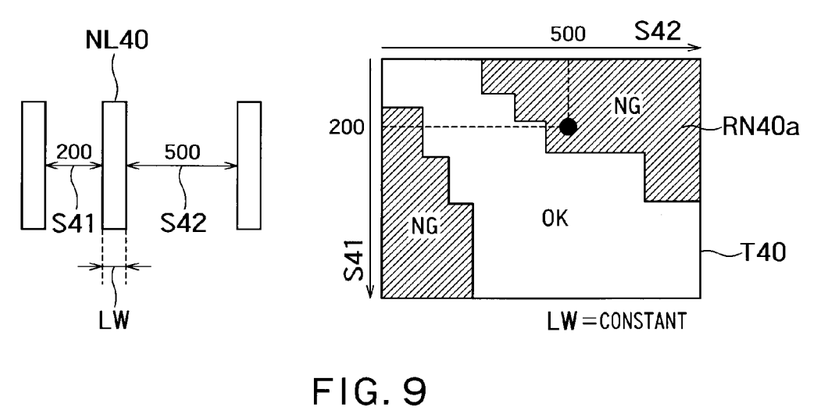
FIG. 9 is an explanatory diagram of a pattern generation method using the design constraint in the first embodiment of the present invention.

First, with regard to a design pattern once generated, the above-mentioned method is used to judge whether the generated design constraint is satisfied by the line width of a line of interest, by a first space width between a line adjacent to one side of the line of interest and the line of interest, and by a second space width between a line adjacent to the other side of the line of interest and the line of interest. For example, as shown in the left of FIG. 9, if the line width LW is constant, if a left space width S41 of a line of interest NL40 is 200 nm and if a right space width S42 thereof is 500 nm, this combination is included in a pattern formation inhibited regions RN40a of a two-dimensional table T40 shown in the right of FIG. 9, and is judged to be an unformable pattern.

Figure 10:
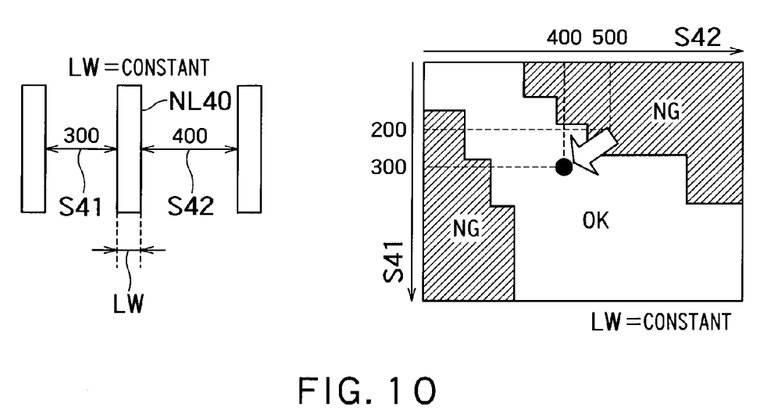
FIG. 10 is an explanatory diagram of a circuit designing method using the design constraint in the first embodiment of the present invention.

Thus, in order for this pattern to be formable, this pattern is corrected to a combination pattern in which the left and right space widths S1, S2 belong to a pattern formation permitted regions RG40, for example, a pattern in which the left space width S41 is 300 nm and the right space width S42 is 400 nm as shown in FIG. 10.

As described above, according to the present embodiment, it is possible to judge whether a circuit pattern once designed can be formed by lithography before converted to a resist pattern. This enables a reduction in turn around time (TAT) of circuit designing.

Figure 11:
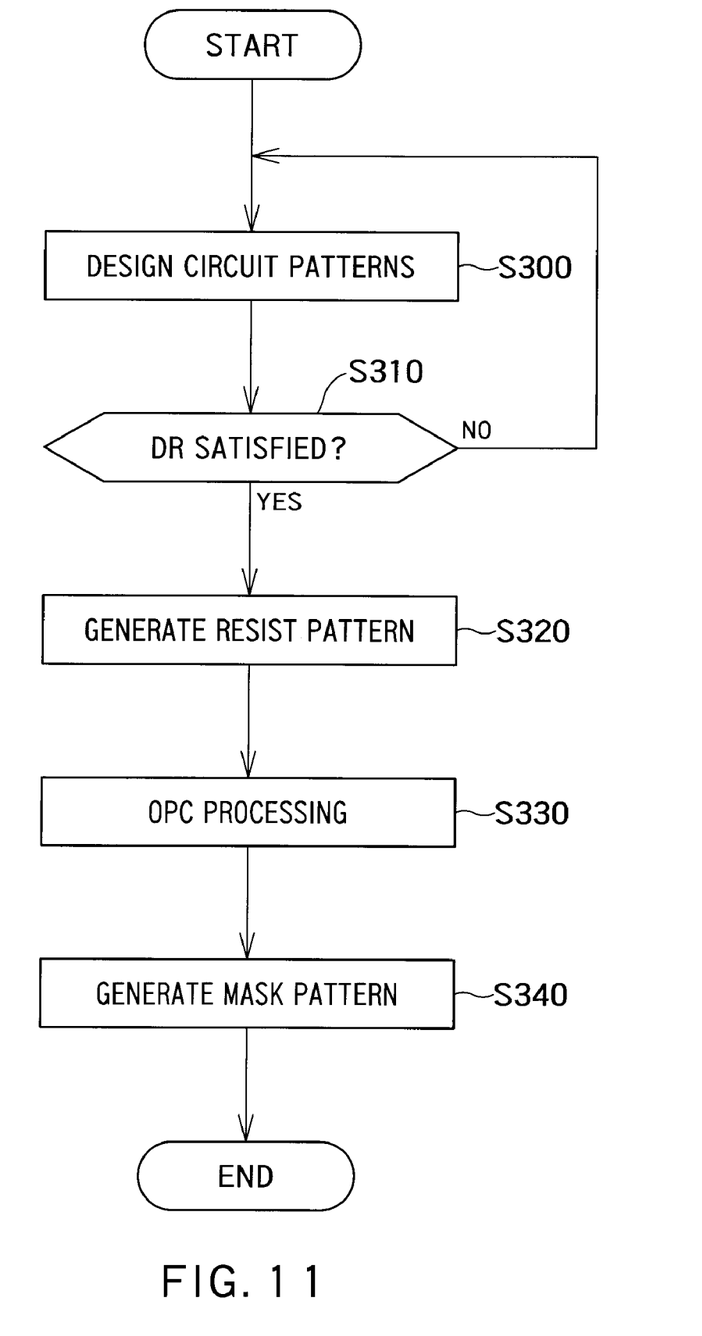
FIG. 11 is a flowchart showing a schematic procedure of the pattern generation method according to the first embodiment of the present invention.

A schematic procedure of the pattern generation method according to the present embodiment is shown in a flowchart of FIG. 11.

First, circuit patterns are once designed (step S300), and DRC is carried out using the above-mentioned design constraint according to the present embodiment (step S310). When there is any circuit pattern which does not satisfy a design rule (hereinafter simply referred to as "DR"), the above-mentioned pattern generation method (FIG. 9 to FIG. 10) is used to correct this pattern to a formable pattern, and a resist pattern is generated in such a manner that all circuit patterns can be formed (step S320). Subsequently, the generated resist pattern is subjected to OPC processing (step S330), and then a mask pattern is generated (step S340).

Figure 12:
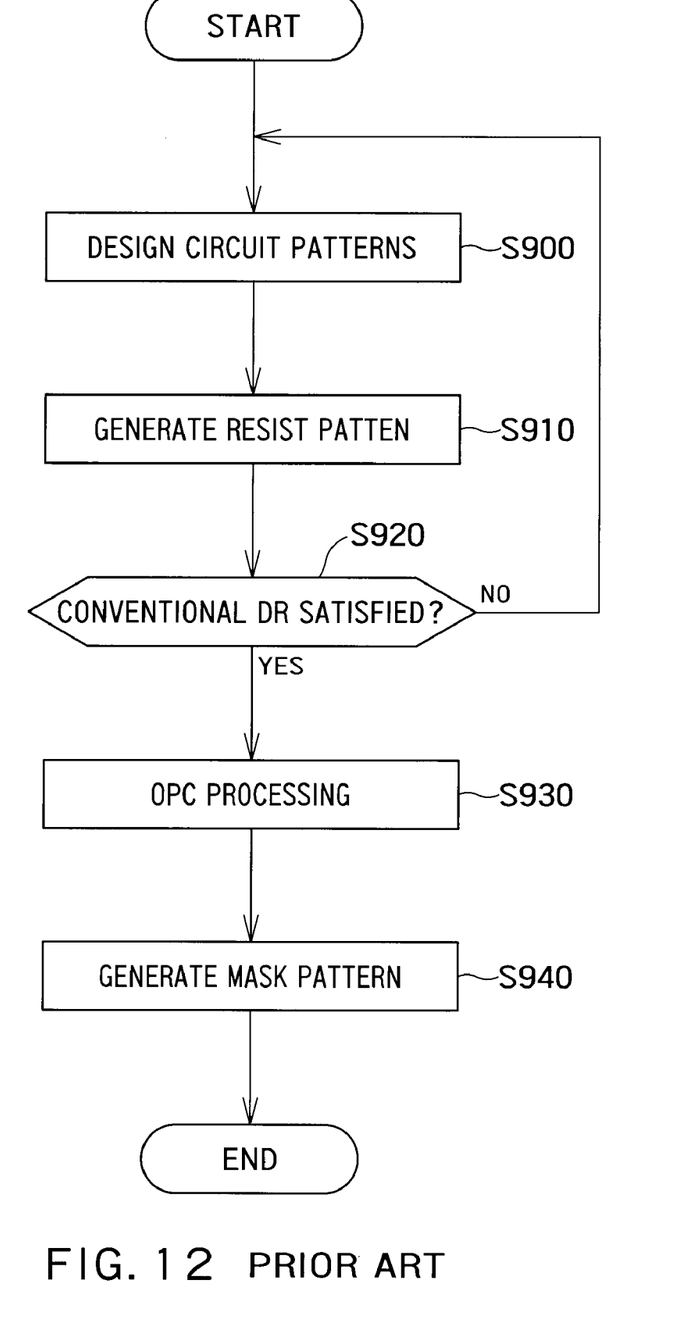
FIG. 12 is a flowchart showing a schematic procedure of one example of a pattern generation method according to a prior art.

A schematic procedure of one example of a pattern generation method according to a prior art is shown as a comparative example in a flowchart of FIG. 12. Conventionally, designing of circuit patterns (step S900) is followed by the conversion of the circuit patterns to resist patterns (step S910), and DRC of the resist patterns is carried out at this stage (step S920). If all the converted resist patterns satisfy the DR, these patterns are subjected to the OPC processing (step S930), and a mask pattern is formed (step S940). However, if there is any resist pattern which does not satisfy the DR (step S920), an inverse conversion operation is needed so that the resist pattern which has already been converted may be returned to a circuit pattern in order to correct the circuit patterns. Therefore, there is a problem of an increased TAT of circuit designing.

According to the present embodiment, the DRC is carried out at the stage of the circuit patterns before converted to the resist patterns. If there is any circuit pattern which does not satisfy the DR, this circuit pattern is corrected before converted to the resist pattern. This enables a significant reduction in the TAT of circuit designing as compared with the pattern generation method according to the prior art.

In the example described above, the left space, for example, of the circuit pattern corresponds to the resist line, and the right space corresponds to the resist space. On the contrary, there is a case where the left space corresponds to the resist space and the right space corresponds to the resist line.

Figure 13:
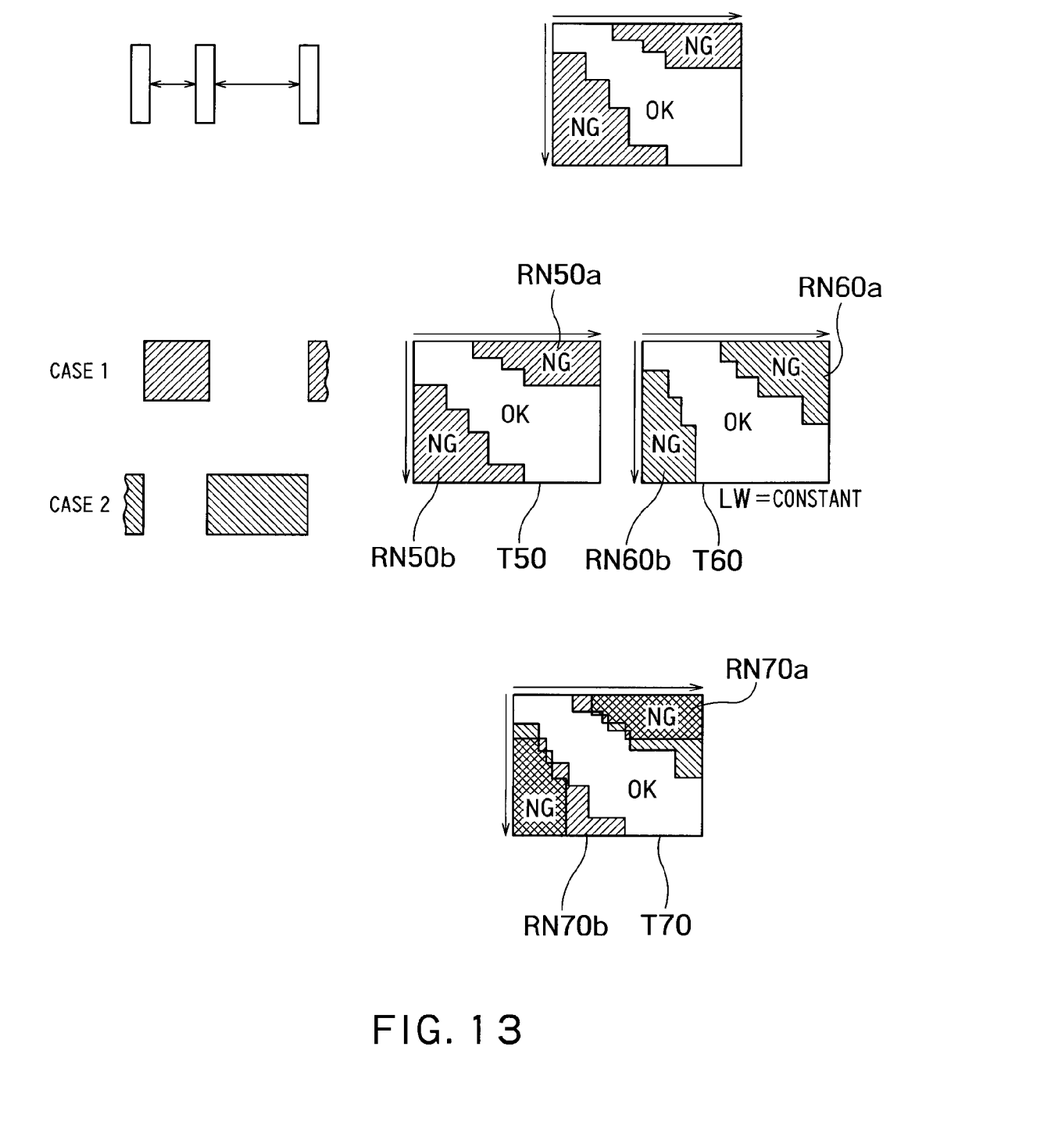
FIG. 13 is a diagram showing one example of design constraints in two cases where left distances of patterns of interest correspond to a resist line and a resist distance, respectively.

FIG. 13 shows one example of design constraints in two cases where the left spaces of patterns of interest correspond to the resist line and the resist space, respectively. In the two contrasting cases as in FIG. 13, easiness in resolution totally differs between an independent pattern and a narrow space pattern, so that the shapes of pattern formation inhibited regions RN50a, RN50b are different from the shapes of pattern formation inhibited regions RN60a, RN60b. Therefore, depending on a design pattern, some patterns are judged to be formable by one design constraint, while some patterns are judged to be unformable by the other design constraint. In such a case, a two-dimensional table T50 corresponding to the independent pattern and a two-dimensional table T60 corresponding to the narrow space pattern may be suitably used as needed. Alternatively, a two-dimensional table T70 may be used which can be obtained by taking an AND between pattern formation inhibited regions 50a, 50b and pattern formation inhibited regions 60a, 60b. Moreover, when the circuit pattern is converted to the resist pattern, the two-dimensional table T50 may be compared with the two-dimensional table T60, and one that allows for a greater process margin for a resist pattern may be selected.

Figure 14:
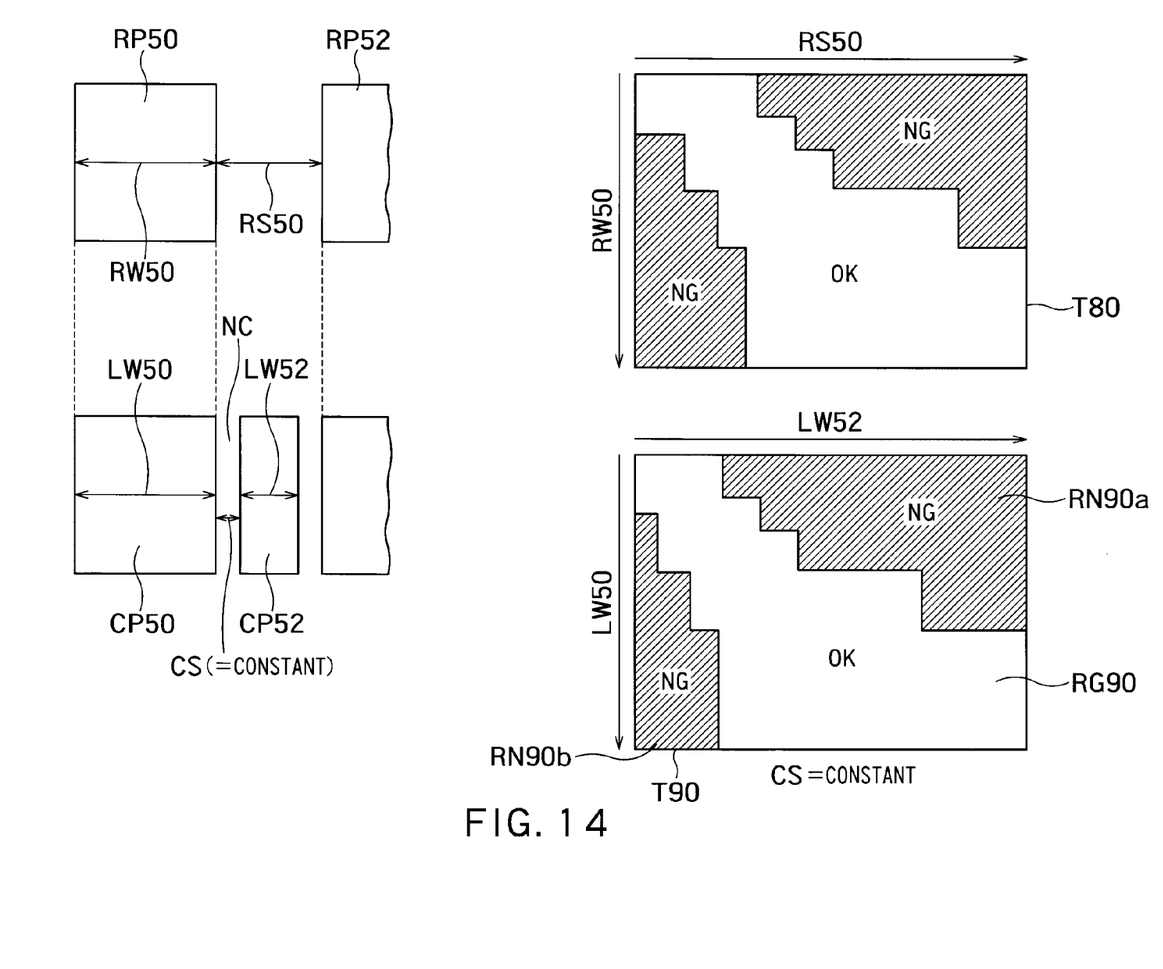
FIG. 14 is an explanatory diagram in which the pattern generation method according to the first embodiment of the present invention is applied to a distance sidewall preserving process.

In the case described above, the line portion of the circuit pattern is formed by the sidewall mask manufacturing process. However, the present invention is not limited to this, and is also applicable to a space sidewall preserving process in which a circuit space is formed by the sidewall mask manufacturing process. That is, in the space sidewall preserving process (second process), a sidewall pattern which is a second pattern formation material is formed in the sidewall portion of a resist pattern, and then a mask material is embedded into a space between sidewall patterns to form a third pattern. Further, the sidewall patterns are removed, and then the resist pattern and the third pattern are processed as masks, such that a space pattern (second pattern) can be formed at the position of the resist pattern sidewall. FIG. 14 is an explanatory diagram in which the pattern formation method according to the present embodiment is applied to the space sidewall preserving process. A design constraint is provided to define a constant width of a circuit pattern space CS, a line width LW50 of a line CP50 adjacent to the circuit pattern space CS, and a line width LW52 of a line CP52. Matching of a resist pattern with a design pattern, a design constraint generating method, etc. can be considered in the similar manner if, for example, the line widths LW50, LW52 of the lines CP50, CP52 between which a space of interest NC in the lower section of FIG. 14 are matched with the right and left spaces S31, S32 of the line of interest NL30 in the left of the lower section of FIG. 8. More specifically, a multidimensional table T80 is generated in accordance with the method according to the prior art for a line width RW50 of a resist pattern RP50 in the upper section of FIG. 14 and for a space width RS50 between a resist pattern RP52 adjacent to the resist pattern RP50 and the resist pattern RP50. The multidimensional table T80 is corrected in accordance with a process conversion difference attributed to the space sidewall preserving process (second process). Then, the resist line width RW50 of the multidimensional table T80 is matched with the line width LW50 of the circuit pattern, and the circuit pattern space CS attributed to sidewall film formation is subtracted from the space width RS50 of the space formation two-dimensional table T80. The result is matched with the line width LW52 of the line width CP52. Thus, as shown in the right of the lower section of FIG. 14, a two-dimensional table T90 in which pattern formation permitted/inhibited regions RN90a, 90b and RG90 have already been defined is acquired.

In addition, the design constraint for the formation of a circuit pattern in one exposure step has been described above as an example. However, in a multiple exposure process of, for example, a trim pattern, a design constraint taking into consideration the alignment accuracy of second and subsequent lithography and pattern-formable dimensions in a resist pattern may be added.

(2) Second Embodiment

In the case described in the present embodiment, the present invention is applied to patterns which do not use the sidewall mask manufacturing process.

Figure 15:
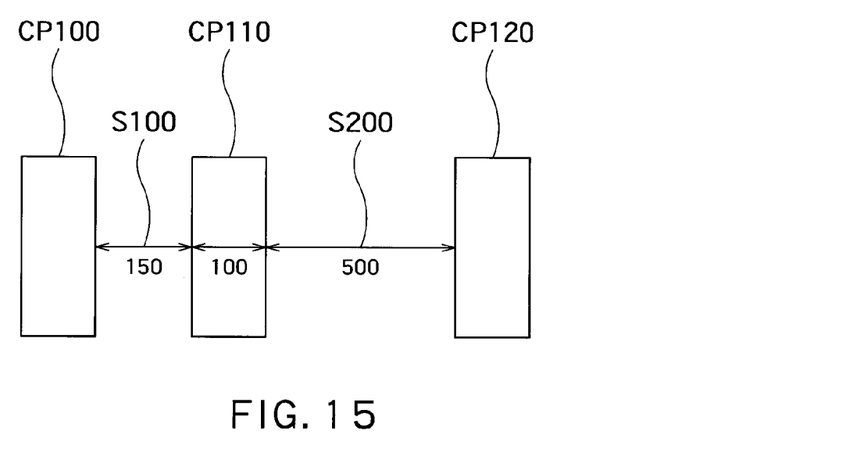
FIG. 15 is a diagram showing one example of nonperiodic and asymmetric patterns.

Even if it is judged depending on the form of arrangement of patterns that the patterns can be formed by a conventional design constraint, it may be proved that the pattern can not be formed when optical rule check (ORC) processing is performed or when exposure to light is actually carried out. One example of such patterns is shown in FIG. 15. Patterns CP100, 110, 120 shown in FIG. 15 are arranged by interposing the line pattern CP110 in between so that spaces S100, S200 are provided starting from the left. The dimensions of the spaces S100, S200 are 150 nm and 500 nm, respectively. This provides a nonperiodic and asymmetric pattern arrangement.

Figure 16:
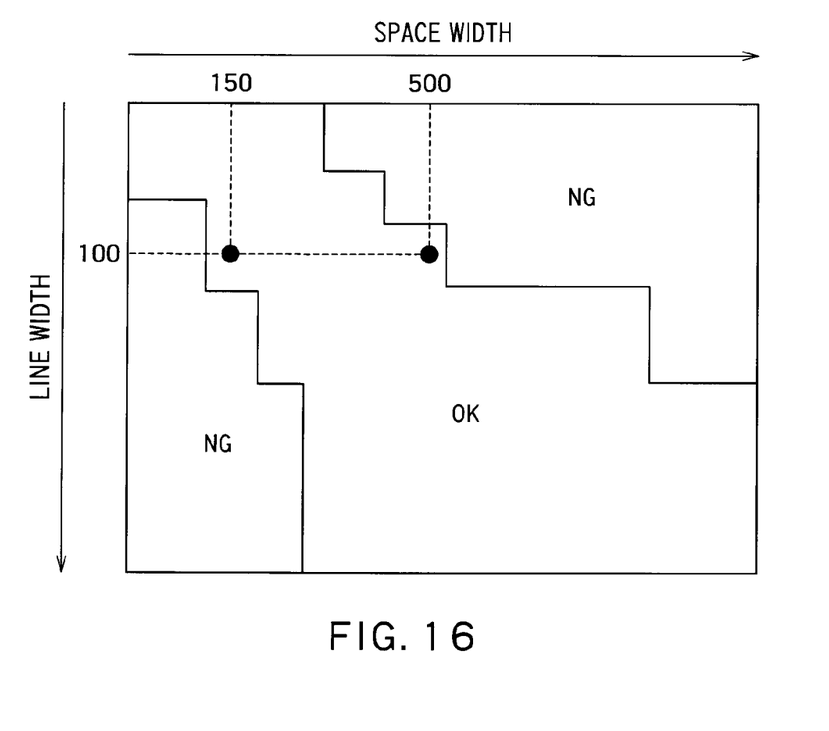
FIG. 16 is a diagram showing an example of a design constraint calculated by a method of a prior art for the pattern shown in FIG. 15.

In FIG. 16, there is shown an example of a design constraint calculated by the method according to the prior art under an optical condition where the patterns shown in FIG. 15 are exposed to light. In the design constraint shown in FIG. 16, the pattern CP110 has L=110 nm, S100=150 nm and S200=500 nm and satisfies the design constraint in FIG. 16, so that the pattern CP110 is judged to be a pattern having passed the DRC.

However, the patterns shown in FIG. 15 are not judged to be unformable until an ORC or actual exposure is carried out, and can not be extracted in advance at the stage of the DRC. The reason is that the degree of lithography allowance is lower in the nonperiodic and asymmetric patterns as shown in FIG. 15 than in patterns in which lines and spaces (hereinafter simply referred to as "LS") are simply repeated.

Figure 17:
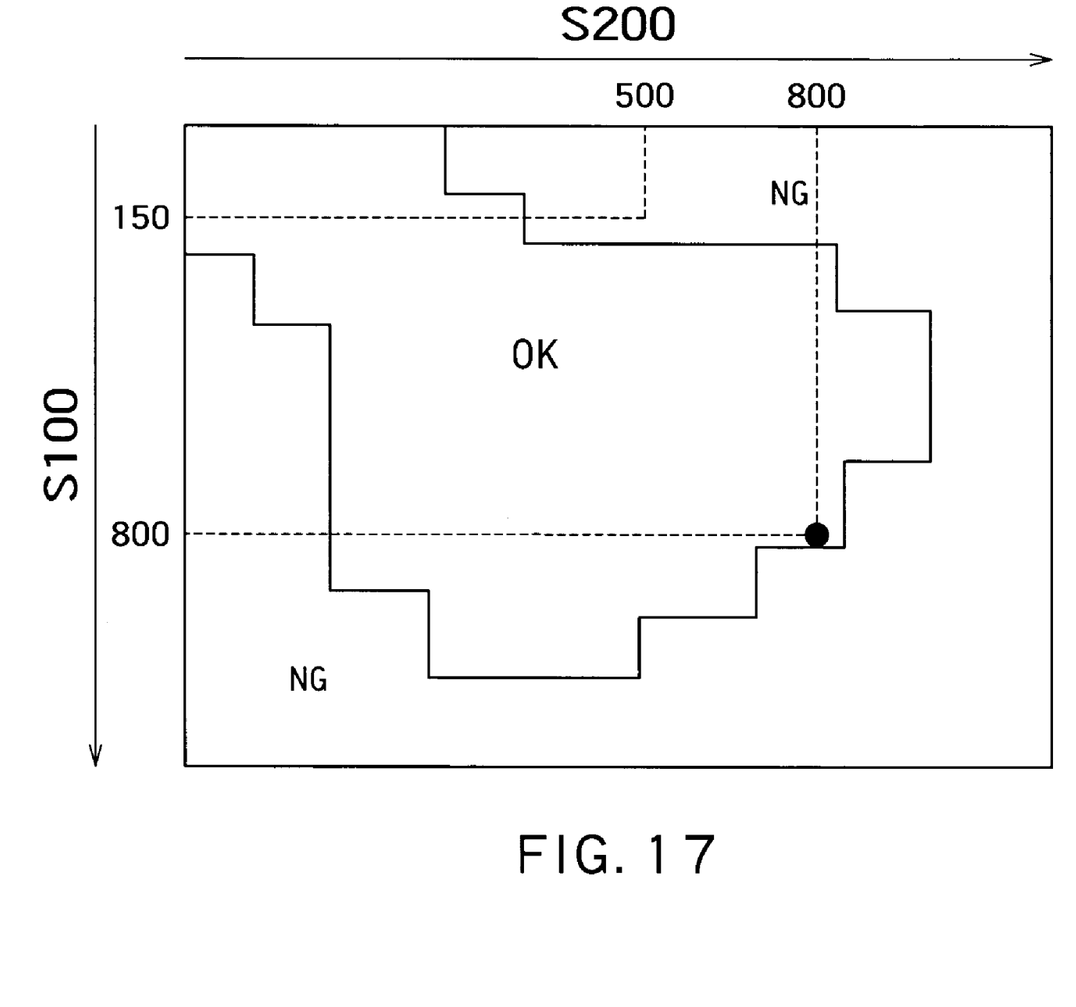
FIG. 17 is a diagram showing an example in which a two-dimensional table described in the first embodiment is generated for the pattern shown in FIG. 15.

Thus, a stricter design constraint is set in the case where the nonperiodic patterns are used as design patterns than in the case where periodic patterns are used as design patterns. In FIG. 17, there is shown an example in which the two-dimensional table described in the first embodiment is generated for the patterns as shown in FIG. 15. According to the example shown in FIG. 17, a pattern with S100=150 nm and S200=500 nm is proved to be an unformable pattern, and can be corrected before converted to a resist pattern. This enables a significant reduction in the TAT of circuit designing as compared with the pattern generation method according to the prior art.

(3) Program

A series of procedures of a pattern verifying method included in the pattern generation method described above may be stored in a recording medium such as a flexible disk or a CD-ROM as a program to be executed by a computer, and read into and executed by the computer. This makes it possible to achieve the pattern verifying method according to the present invention by use of a general-purpose computer. The recording medium is not limited to a portable medium such as a magnetic disk or an optical disk, and may be a fixed recording medium such as a hard disk drive or a recording medium. Further, the program incorporating the series of procedures of the pattern formation method described above may be distributed via a communication line (including wireless communication) such as the Internet. Moreover, the program incorporating the series of procedures of the pattern formation method described above may be distributed in an encrypted, modulated or compressed state via a wired line or a wireless line such as the Internet or in a manner stored in a recording medium.

(4) Semiconductor Device Manufacturing Method

When a semiconductor device is manufactured in such a manner described below, the TAT in circuit designing is significantly reduced. This makes it possible to reduce the manufacturing cost of the device and accelerate the supply to the market.

Specifically, a resist pattern (first pattern) is acquired from a design pattern generated by the pattern generation method described above; A mask pattern for transferring the resist pattern is generated; The generated mask pattern is formed on a mask; The obtained mask is exposed to light to transfer the mask pattern onto a resist film formed on a process target film; and a pattern is further processed and formed on the process target film.

While some of the embodiments of the present invention have been described above, it should be understood that the present invention is not limited to the embodiments described above, and various modifications can be made within the scope thereof. A circuit line width of 100 nm or more and 500 nm or less has been taken as an example in the embodiments described above. However, the present invention does not limit the circuit line width and is naturally applicable to a circuit line width less than 100 nm or more than 500 nm.

What is claimed is:

1. A pattern generation method of a design pattern for use in circuit pattern formation, the method comprising:
   acquiring, by using a computer, a first design constraint for first patterns to be formed on a film by a first process, the first design constraint using, as indices, a pattern width of an arbitrary one of the first patterns, and a space between the arbitrary one of the first patterns and a pattern adjacent to the arbitrary one of the first patterns;
   modifying, by using the computer, the first design constraint according to a pattern conversion to obtain a second design constraint for second patterns, the pattern conversion being achieved by performing a second process to form the second patterns on the film based on the arbitrary one of the first patterns, the second design constraint using, as indices, two pattern spaces on both sides of a predetermined one of the second patterns, or widths of two patterns on both sides of a predetermined pattern space of the second patterns;
   judging, by using the computer, whether the design pattern satisfies the second design constraint; and
   changing, by using the computer, the design pattern in the case where the design pattern does not satisfy the second design constraint, so that the changed design pattern satisfies the second design constraint,
   wherein the second process comprises:
      forming second pattern formation materials on sidewalls of the first patterns; and
      removing the first patterns to leave the second pattern formation materials to form sidewall patterns as the second patterns.

2. The pattern generation method according to claim 1, wherein:
   the arbitrary one of the first patterns comprises a plurality of patterns having different pattern widths,
   the first design constraint is acquired for each of the different pattern widths, and
   the second design constraint is acquired using a pattern width of the predetermined one of the second patterns as a third index.

3. The pattern generation method according to claim 1, wherein the second design constraint is acquired by:
   acquiring a first subsidiary design constraint which uses, as first and second indices, two pattern spaces on both sides of the predetermined one of the second patterns;
   acquiring a second subsidiary design constraint which uses, as first and second indices, two patterns on both sides of the predetermined pattern space of the second patterns; and
   extracting overlapping portions in the first and second subsidiary design constraints.

4. The pattern generation method according to claim 1, wherein the second design constraint is acquired by:
   acquiring a first subsidiary design constraint which uses, as first and second indices, two pattern spaces on both sides of the predetermined one of the second patterns;
   acquiring a second subsidiary design constraint which uses, as first and second indices, two patterns on both sides of the predetermined pattern space of the second patterns; and
   selecting one of the first and second subsidiary design constraints which allows for a greater process margin for the first patterns.

5. The pattern generation method according to claim 1, wherein
   the second process comprises a step of slimming the first patterns, and
   acquiring the second design constraint comprises correcting the first design constraint in accordance with an amount of slimming the first patterns.

6. The pattern generation method according to claim 1, wherein an amount of the pattern conversion comprises at least one of an amount of a mask conversion difference attributed to the second process and an amount of a process conversion difference.

7. A pattern generation method of a design pattern for use in circuit pattern formation, the method comprising:
   acquiring, by using a computer, a first design constraint for first patterns to be formed on a film by a first process, the first design constraint using, as indices, a pattern width of an arbitrary one of the first patterns, and a space between the arbitrary one of the first patterns and a pattern adjacent to the arbitrary one of the first patterns;
   modifying, by using the computer, the first design constraint according to a pattern conversion to obtain a second design constraint for second patterns, the pattern conversion being achieved by performing a second process to form the second patterns on the film based on the arbitrary one of the first patterns, the second design constraint using, as indices, two pattern spaces on both sides of a predetermined one of the second patterns, or widths of two patterns on both sides of a predetermined pattern space of the second patterns;
   judging, by using the computer, whether the design pattern satisfies the second design constraint; and
   changing, by using the computer, the design pattern in the case where the design pattern does not satisfy the second design constraint, so that the changed design pattern satisfies the second design constraint,
   wherein the second process comprises:
      forming sidewall patterns on sidewalls of the first patterns;

embedding a mask material into a pattern space between the sidewall patterns; and removing the sidewall patterns to leave the first pattern and the mask material to form the second patterns.

8. The pattern generation method according to claim 7, wherein:

the arbitrary one of the first patterns comprises a plurality of patterns having different pattern widths, the first design constraint is acquired for each of the different pattern widths, and the second design constraint is acquired using a space width of the predetermined pattern space of the second patterns as a third index.

9. A non-transitory computer-readable recording medium containing a program which causes a computer to execute a pattern verifying method of a design pattern for use in circuit pattern formation, the method comprising:

acquiring a first design constraint for first patterns to be formed on a film by a first process, the first design constraint using, as indices, a pattern width of an arbitrary one of the first patterns, and a space between the arbitrary one of the first patterns and a pattern adjacent to the arbitrary one of the first patterns;

modifying the first design constraint according to a pattern conversion to obtain a second design constraint for second patterns, the pattern conversion being achieved by performing a second process to form the second patterns on the film based on the arbitrary one of the first patterns, the second design constraint using, as indices, two pattern spaces on both sides of a predetermined one of the second patterns, or widths of two patterns on both sides of a predetermined pattern space of the second patterns;

judging whether the design pattern satisfies the second design constraint; and changing the design pattern in the case where the design pattern does not satisfy the second design constraint, so that the changed design pattern satisfies the second design constraint, wherein the second process comprises:

forming second pattern formation materials on sidewalls of the first patterns; and removing the first patterns to leave the second pattern formation materials to form sidewall patterns as the second patterns.

10. The non-transitory medium according to claim 9, wherein the arbitrary one of the first patterns comprises a plurality of patterns having different pattern widths, the first design constraint is acquired for each of the different pattern widths, and the second design constraint is acquired using a pattern width of the predetermined one of the second patterns as a third index.

11. A non-transitory computer-readable recording medium containing a program which causes a computer to execute a pattern verifying method of a design pattern for use in circuit pattern formation, the method comprising:

acquiring a first design constraint for first patterns to be formed on a film by a first process, the first design constraint using, as indices, a pattern width of an arbitrary one of the first patterns, and a space between the arbitrary one of the first patterns and a pattern adjacent to the arbitrary one of the first patterns;

modifying the first design constraint according to a pattern conversion to obtain a second design constraint for second patterns, the pattern conversion being achieved by performing a second process to form the second patterns on the film based on the arbitrary one of the first patterns, the second design constraint using, as indices, two pattern spaces on both sides of a predetermined one of the second patterns, or widths of two patterns on both sides of a predetermined pattern space of the second patterns;

judging whether the design pattern satisfies the second design constraint; and changing the design pattern in the case where the design pattern does not satisfy the second design constraint, so that the changed design pattern satisfies the second design constraint, wherein the second process comprises:

forming sidewall patterns on sidewalls of the first patterns;

embedding a mask material into a pattern space between the sidewall patterns; and removing the sidewall patterns to leave the first pattern and the mask material to form the second patterns.

12. The non-transitory medium according to claim 11, wherein:

the arbitrary one of the first patterns comprises a plurality of patterns having different pattern widths, the first design constraint is acquired for each of the different pattern widths, and the second design constraint is acquired using a space width of the predetermined pattern space of the second patterns as a third index.

13. A semiconductor device manufacturing method comprising:

acquiring first patterns to be formed on a film by a first process from a design pattern that is generated by use of a pattern generation method of the design pattern for use in circuit pattern formation;

forming a mask to transfer and form the acquired first patterns;

exposing the formed mask to light to form the first patterns on the film;

forming second patterns on the film by a second process subsequent on the basis of the first patterns, the second patterns being used to form a circuit pattern on the film in conformity with the design pattern; and processing the film by use of the second patterns to form the circuit pattern on the film, wherein the pattern generation method comprises:

acquiring a first design constraint for the first patterns which uses, as indices, a pattern width of an arbitrary one of the first patterns, and a space between the arbitrary one of the first patterns and a pattern adjacent to the arbitrary one of the first patterns;

modifying the first design constraint according to a pattern conversion to obtain a second design constraint for second patterns, the pattern conversion being achieved by performing the second process to form second patterns on the film based on the arbitrary one of the first patterns, the second design constraint using, as indices, two pattern spaces on both sides of a predetermined one of the second patterns, or widths of two patterns on both sides of a predetermined pattern space of the second patterns;

judging whether the design pattern satisfies the second design constraint; and changing the design pattern in the case where the design pattern does not satisfy the second design constraint, so that the changed design pattern satisfies the second design constraint, wherein the second process comprises:

forming second pattern formation materials on sidewalls of the first patterns; and removing the first patterns to leave the second pattern formation materials to form a sidewall patterns as the second pattern.

14. The semiconductor device manufacturing method according to claim 13, wherein:
   the arbitrary one of the first patterns comprises a plurality of patterns having different pattern widths,
   the first design constraint is acquired for each of the different pattern widths, and
   the second design constraint is acquired using a pattern width of the predetermined one of the second patterns as a third index.

15. The semiconductor device manufacturing method according to claim 13, wherein:
   the second process includes a step of slimming the first patterns, and
   acquiring the second design constraint comprises correcting the first design constraint in accordance with an amount of slimming the first patterns.

16. A semiconductor device manufacturing method comprising:
   acquiring first patterns to be formed on a film by a first process from a design pattern that is generated by use of a pattern generation method of the design pattern for use in circuit pattern formation;
   forming a mask to transfer and form the acquired first patterns;
   exposing the formed mask to light to form the first patterns on the film;
   forming second patterns on the film by a second process subsequent on the basis of the first patterns, the second patterns being used to form a circuit pattern on the film in conformity with the design pattern; and
   processing the film by use of the second patterns to form the circuit pattern on the film,
   wherein the pattern generation method comprises:
      acquiring a first design constraint for the first patterns which uses, as indices, a pattern width of an arbitrary one of the first patterns, and a space between the arbitrary one of the first patterns and a pattern adjacent to the arbitrary one of the first patterns;
      modifying the first design constraint according to a pattern conversion to obtain a second design constraint for second patterns, the pattern conversion being achieved by performing the second process to form second patterns on the film based on the arbitrary one of the first patterns, the second design constraint using, as indices, two pattern spaces on both sides of a predetermined one of the second patterns, or widths of two patterns on both sides of a predetermined pattern space of the second patterns;
      judging whether the design pattern satisfies the second design constraint; and
      changing the design pattern in the case where the design pattern does not satisfy the second design constraint, so that the changed design pattern satisfies the second design constraint,
   wherein the second process comprises:
      forming sidewall patterns on sidewalls of the first patterns;
      embedding a mask material into a pattern space between the sidewall patterns; and
      removing the sidewall patterns to leave the first pattern and the mask material to form the second patterns.

17. The semiconductor device manufacturing method according to claim 16, wherein:
   the arbitrary one of the first patterns comprises a plurality of patterns having different pattern widths,
   the first design constraint is acquired for each of the different pattern widths, and
   the second design constraint is acquired using a space width of the predetermined pattern space of the second patterns as a third index.

* * * * *